(12) United States Patent
Im

(10) Patent No.: US 11,439,011 B2
(45) Date of Patent: Sep. 6, 2022

(54) ELECTRONIC DEVICE MODULE AND METHOD OF MANUFACTURING ELECTRONIC DEVICE MODULE

(71) Applicant: SAMSUNG ELECTRO-MECHANICS CO., LTD., Suwon-si (KR)

(72) Inventor: Sungwon Im, Suwon-si (KR)

(73) Assignee: Samsung Electro-Mechanics Co., Ltd., Suwon-si (KR)

(*) Notice: Subject to any disclaimer, the term of this patent is extended or adjusted under 35 U.S.C. 154(b) by 0 days.

(21) Appl. No.: 17/239,907

(22) Filed: Apr. 26, 2021

(65) Prior Publication Data
US 2022/0132665 A1    Apr. 28, 2022

(30) Foreign Application Priority Data

Oct. 23, 2020    (KR) .......................... 10-2020-0138563

(51) Int. Cl.
*H05K 1/18*    (2006.01)
*H05K 1/11*    (2006.01)
(Continued)

(52) U.S. Cl.
CPC .......... *H05K 1/118* (2013.01); *H05K 1/0243* (2013.01); *H05K 1/147* (2013.01); *H05K 3/361* (2013.01); *H05K 7/1053* (2013.01)

(58) Field of Classification Search
CPC ...... H05K 1/118; H05K 1/0243; H05K 1/147; H05K 3/361; H05K 7/1053
See application file for complete search history.

(56) References Cited

U.S. PATENT DOCUMENTS

| | | | |
|---|---|---|---|
| 8,971,047 B2 * | 3/2015 | Lee ......................... | H05K 3/361 361/749 |
| 2006/0170597 A1 * | 8/2006 | Kurashima ............ | H01Q 1/242 343/795 |

(Continued)

FOREIGN PATENT DOCUMENTS

KR    10-2015-0127369 A    11/2015
KR       10-1772490 B1      8/2017
(Continued)

OTHER PUBLICATIONS

Korean Office Action dated Jan. 21, 2022 in corresponding Korean Patent Application No. 10-2020-0138563. (8 pages in Korean).

*Primary Examiner* — Binh B Tran
(74) *Attorney, Agent, or Firm* — NSIP Law

(57) ABSTRACT

An electronic device module includes: a first board having first surface and a second surface facing opposite directions; electronic devices mounted on the first and second surfaces, respectively; a second board bonded to the second surface and including a device receiving part in which a device, among the electronic devices, is received, wherein the device receiving part is formed by a central opening of the second board; a first flexible printed circuit board including a first end part and a second end part disposed on opposite ends of the first flexible printed circuit board, wherein the first flexible printed circuit board is more flexible than the first and second boards, and wherein the first end part is formed integrally with the second board, is electrically connected to one end of the second board, and extends outside the second board; and a connector mounted on the second end part.

20 Claims, 12 Drawing Sheets

(51) Int. Cl.
  *H05K 1/14*   (2006.01)
  *H05K 1/02*   (2006.01)
  *H05K 7/10*   (2006.01)
  *H05K 3/36*   (2006.01)

(56) References Cited

U.S. PATENT DOCUMENTS

| | | | |
|---|---|---|---|
| 2007/0178751 A1* | 8/2007 | Yamamoto | H05K 1/118 |
| | | | 439/495 |
| 2012/0307461 A1* | 12/2012 | Liskow | H05K 3/281 |
| | | | 174/251 |
| 2015/0325529 A1 | 11/2015 | Choi | |
| 2019/0304926 A1* | 10/2019 | Ryu | H01L 23/3121 |
| 2020/0153079 A1* | 5/2020 | Lei | H05K 5/0069 |
| 2020/0178401 A1 | 6/2020 | Min et al. | |
| 2020/0194893 A1 | 6/2020 | Im | |

FOREIGN PATENT DOCUMENTS

| | | |
|---|---|---|
| KR | 10-1994715 B1 | 7/2019 |
| KR | 10-2019-0115388 A | 10/2019 |
| KR | 10-2020-0067613 A | 6/2020 |
| KR | 10-2020-0073572 A | 6/2020 |

* cited by examiner

ELECTRONIC DEVICE MODULE AND METHOD OF MANUFACTURING ELECTRONIC DEVICE MODULE

CROSS-REFERENCE TO RELATED APPLICATIONS

This application claims the benefit under 35 U.S.C. § 119(a) of Korean Patent Application No. 10-2020-0138563 filed in the Korean Intellectual Property Office on Oct. 23, 2020, the entire disclosure of which is incorporated herein by reference for all purposes.

BACKGROUND

1. Field

The following description relates to a module on which an electronic device is mounted on a board and a method of manufacturing such a module.

2. Description of Related Art

With the development of smart devices, a demand for personal and portable electronic products is rapidly increasing. In order to enhance the portability while improving the functions and performance of the smart devices, down-sizing and weight reduction of electronic components embedded in such smart devices are continuously required.

In order to realize the down-sizing and weight reduction of the electronic components, along with the technological development in the direction of reducing the individual size of mounting components, the development of a technology of integrating a plurality of individual elements into a single electronic component has been conducted in parallel therewith. In addition, a module in a form of a double-sided mounting package that disposes components on both sides of the module is being developed to down-size the module, and in a case of RFIC (Radio-Frequency Integrated Circuit) components used in these modules, the down-sizing is also required and is being developed in the form of a CSP (Chip Scale Package or Chip Size Package).

In smartphones, in order to implement a WiFi function, most of the WiFi modules implemented with a semiconductor package are soldered to the smartphone board to be mounted. In contrast, personal computers (PCs) implement their functions by embedding a standardized card type of WiFi card. The card type is much easier to implement than the soldering, but it is difficult to apply the card type to the smart phone due to a space problem.

In a WiFi module currently being developed, a double-sided mounting technology is applied for the down-sizing, and, even in this case, after mounting the components on both sides of the WiFi module, molding and shielding are performed on the upper surface, but the molding and shielding are not possible on the bottom surface due to a problem of signal terminal processing.

The above information disclosed in this Background section is only for enhancement of understanding of the background of the disclosure, and therefore it may contain information that does not form the prior art that is already known to a person of ordinary skill in the art.

SUMMARY

This Summary is provided to introduce a selection of concepts in simplified form that are further described below in the Detailed Description. This Summary is not intended to identify key features or essential features of the claimed subject matter, nor is it intended to be used as an aid in determining the scope of the claimed subject matter.

In one general aspect, an electronic device module includes: a first board having first surface and a second surface facing opposite directions; electronic devices mounted on the first and second surfaces, respectively; a second board bonded to the second surface and including a device receiving part in which a device, among the electronic devices, is received, wherein the device receiving part is formed by a central opening of the second board; a first flexible printed circuit (FPC) board including a first end part and a second end part disposed on opposite ends of the first flexible printed circuit (FPC) board, wherein the first flexible printed circuit (FPC) board is more flexible than the first board and the second board, and wherein the first end part is formed integrally with the second board, is electrically connected to one end of the second board, and extends outside the second board; and a connector mounted on the second end part.

The electronic device module may further include a second FPC board including a third end part and a fourth end part disposed on opposing ends of the second FPC board, wherein the third end part extends outside the second board and is electrically connected to another end of the second board.

The electronic device module may further include: a connector mounted on the fourth end part.

The electronic device module may further include an antenna mounted on the fourth end part.

The second flexible printed circuit (FPC) board may be formed integrally with the second board, may be electrically connected to the second board, and may extend outside the second board.

The electronic device module may further include a bottom surface molded part mounted on the second surface of the first board. The bottom surface molded part may cover the electronic device, among the electronic devices, received in the device receiving part, and may fill and seal the device receiving part.

The electronic device module may further include a bottom surface conductive layer covering the bottom surface molded part and formed on a surface of the bottom surface molded part.

The bottom surface conductive layer may be connected to a ground of the second board.

The second board may further include an outer surface opposite to a surface of the second board in contact with the first board. The surface of the bottom surface molded part and the outer surface of the second board may be disposed on a same plane.

The electronic device module may further include an upper surface molded part covering and sealing an electronic device, among the electronic devices, mounted on the first surface.

The electronic device module may further include: an upper surface conductive layer covering the upper surface molded part and formed on a surface of the upper surface molded part.

An electrode pad may not protrude on an outer surface of the second board opposite to a surface of the second board in contact with the first board.

In another general aspect, a method of manufacturing an electronic device module includes: mounting a first electronic device on a first surface of a first board; forming an upper surface molded part covering and sealing the first electronic device on the first surface of the first board; mounting a second electronic device on a second surface of the first board disposed opposite to the first surface of the first board; attaching the first board to a second board such that the second electronic device is received in a device receiving part of the second board, wherein the device receiving part is formed by a central opening of the second board, and wherein a flexible printed circuit (FPC) board is connected to one end of the second board and is extended outside the second board; and forming a bottom surface molded part covering the second electronic device by filling the device receiving part with a mold material and curing the mold material.

The method may further include forming a bottom surface conductive layer covering the bottom surface molded part on a surface of the bottom surface molded part and at least part of an outer surface of the second board.

The method may further include mounting an electrical connector or an antenna on the flexible printed circuit (FPC) board.

The method of claim 13, further comprising removing a portion of the bottom surface molded part such that an outer surface of the bottom surface molded part is on a same plane as an outer surface of the second board surrounding the bottom surface molded part.

In another general aspect, an electronic device includes: a set board; and an electronic device module disposed on the set board. The electronic device module includes: a first board having first surface and a second surface facing opposite directions; a first electronic device mounted on the first surface; a second electronic device mounted on the second surface; a second board bonded to the second surface and including a central open space in which the second electronic device is disposed; a flexible printed circuit (FPC) board including a first end part and a second end part disposed on opposite ends of the flexible printed circuit (FPC) board, wherein the flexible printed circuit (FPC) board is more flexible than the first board and the second board, and wherein the first end part is formed integrally with the second board, is electrically connected to one end of the second board, and extends outside the second board; and a connector mounted on the second end part.

The electronic device may further include a second FPC board including a third end part and a fourth end part disposed on opposing ends of the second FPC board, wherein the third end part extends outside the second board and is electrically connected to another end of the second board.

The electronic device may further include a connector mounted on the fourth end part.

The electronic device may further include an antenna mounted on the fourth end part.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative sizes, proportions, and depictions of elements in the drawings may be exaggerated for clarity, illustration, and convenience.

DETAILED DESCRIPTION OF THE EMBODIMENTS

Figure 1:
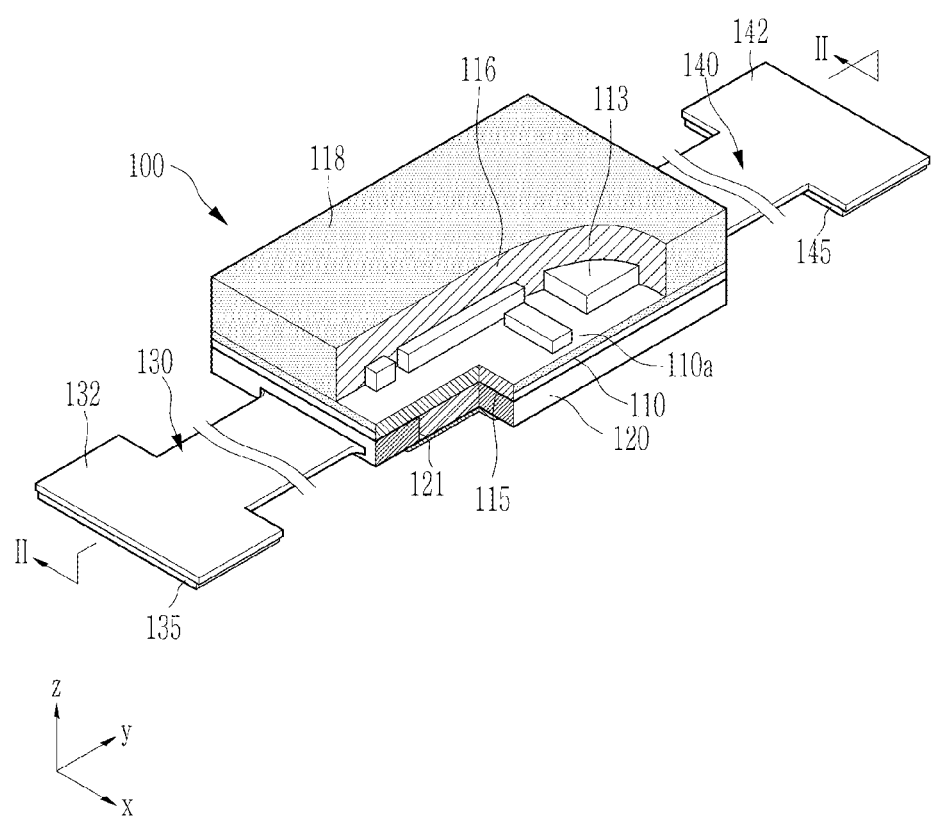
FIG. 1 is a partially cut-away perspective view showing an electronic device module, according to an embodiment.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of this disclosure. For example, the sequences of operations described herein are merely examples, and are not limited to those set forth herein, but may be changed as will be apparent after an understanding of this disclosure, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of this disclosure. Hereinafter, while embodiments of the present disclosure will be described in detail with reference to the accompanying drawings, it is noted that examples are not limited to the same.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween. As used herein "portion" of an element may include the whole element or less than the whole element.

As used herein, the term "and/or" includes any one and any combination of any two or more of the associated listed items; likewise, "at least one of" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms, such as "above," "upper," "below," "lower," and the like, may be used herein for ease of description to describe one element's relationship to another element as illustrated in the figures. Such spatially relative terms are intended to encompass different orientations of the device in use or operation in addition to the orientation depicted in the figures. For example, if the device in the figures is turned over, an element described as being "above," or "upper" relative to another element would then be "below," or "lower" relative to the other element. Thus, the term "above" encompasses both the above and below orientations depending on the spatial orientation of the device. The device may also be oriented in other ways (rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of this disclosure. Further, although the examples described herein have a variety of configurations, other configurations are possible as will be apparent after an understanding of this disclosure.

Herein, it is noted that use of the term "may" with respect to an example, for example, as to what an example may include or implement, means that at least one example exists in which such a feature is included or implemented while all examples are not limited thereto.

Figure 2:
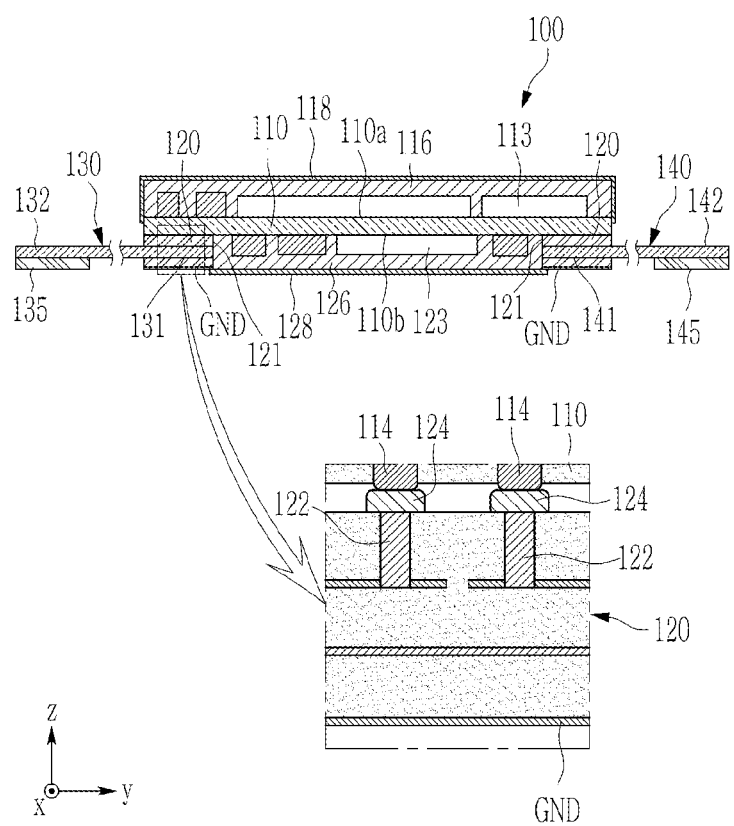
FIG. 2 is a cross-sectional view of the electronic device module shown in FIG. 1 taken along a line II-II of FIG. 1.

FIG. 1 is a partially cut-away perspective view showing an electronic device module 100, according to an embodiment. FIG. 2 is a cross-sectional view of the electronic device module 100 taken along a line II-II of FIG. 1.

Referring to FIG. 1 and FIG. 2, the electronic device module 100 according to the present exemplary embodiment may include, for example, a first board 110 and a second board 120 bonded to each other through a bonding layer 115 interposed therebetween. The first board 110 may be a multi-layered circuit board formed by repeatedly stacking, for example, a plurality of insulation layers and a plurality of wiring layers in alternating order, and may be composed of a double-sided circuit board in which the wiring layers are formed on both sides of one insulation layer. The first board 110 has a first surface 110a and a second surface 110b facing opposite directions along a z-axis direction of the drawing. The second board 120 may be bonded to the second surface 110b of the first board 110.

The second board 120 includes a device receiving part 121 including a space through which the central portion of the receiving part 121 is removed. Therefore, when the second board 120 is attached to the first board 110 through a soldering process, the device receiving part 121 may form a space depressed to be concave while opening one side of the resultant structure to expose a part of the second surface 110b of the first board 110.

The first electronic device 113 may be mounted on the first surface 110a of the first board 110, and the second electronic device 123 may be mounted on the second surface 110b of the first board 110. The second electronic device 123 may be mounted on the second surface 110b of the first board 110 while being disposed in the device receiving part 121 of the second board 120.

The first electronic device 113 may include an active device such as an integrated circuit chip (IC chip) or a passive device. That is, the first electronic device 113 may be any type of device that may be mounted on the first board 110 or may be embedded in the first board 110. For example, the first electronic device 113 may include a radio frequency integrated circuit (RFIC) chip, a WiFi integrated circuit (WiFi IC) chip, or a multi-layer ceramic capacitor (MLCC).

The second electronic device 123 includes an integrated circuit (IC) chip, and for example, may include a radio-frequency integrated circuit (RFIC) chip. In addition, the IC chip may include a chip scale package (CSP).

An upper surface molded part 116 covering and sealing the first electronic device 113 may be formed on the first surface 110a of the first board 110. The upper surface molded part 116 may be extended to cover the side surface of the first electronic device 113 and configured to contact the first board 110. The upper surface molded part 116 may be formed by using, for example, an epoxy mold compound (EMC) as a mold material.

The upper surface conductive layer 118 is formed by covering the upper and side surfaces of the upper surface molded part 116, and the upper surface conductive layer 118 may extend to a part of the side surface of the first board 110. The upper surface conductive layer 118 may be formed by depositing a conductive material along the surface of the upper surface molded part 116 and the side surface of the first board 110 to function as an electromagnetic interference (EMI) shield film. For example, the upper surface conductive layer 118 may be deposited in a sputtering process.

In addition, a bottom surface molded part 126 that covers and seals the second electronic device 123 may be formed on the second surface 110b of the first board 110. The bottom surface molded part 126 may fill the device receiving part 121 of the second board 120 to seal the second electronic device 123. The bottom surface molded part 126, when cured by filling the device receiving part 121, may be formed to have a height in the thickness direction of the second board 120 that is the same as a height of the second board 120 in the thickness direction of the second board 120. That is, considering that the second board 120 has an outer surface (e.g., lower surface) facing a direction opposite to a direction faced by a surface of the second board 120 in contact with the first board 110, the surface (e.g., lower surface) of the bottom surface molded part 126 exposed to the outside may be positioned on the same plane as the outer surface (e.g., lower surface) of the second board 120. To achieve this co-planar configuration of the outer surface (e.g., lower surface) of the bottom surface molded part 126 and the outer surface (e.g., lower surface) of the second board 120, the outer surface of the bottom surface molded part 126 may be flattened using a grinder, after being filled in the device receiving part 121 and cured.

A bottom surface conductive layer 128 may be formed on the lower surface of the bottom surface molded part 126 while covering the bottom surface molded part 126. The bottom surface conductive layer 128 is formed to have the area larger than the plane area of the device receiving part 121 and then may be coated to cover all the lower surface of the bottom surface molded part 126 defined by the boundary of the device receiving part 121. Therefore, the bottom surface conductive layer 128 may be formed to cover a portion of the outer surface (e.g., lower surface) of the second board 120 adjacent to the lower surface of the bottom surface molded part 126. The bottom surface conductive layer 128 may be connected to the ground GND by exposing a ground GND of the inside of the second board 120 to form the bottom surface conductive layer 128 to be connected to the ground GND.

The electronic device module 100 may further include a first flexible printed circuit (FPC) board 130 and a second flexible printed circuit (FPC) board 140 that are connected to the second board 120. The first flexible printed circuit (FPC) board 130 includes a first end part 131 and a second end part 132 disposed on different (e.g., opposite) ends of the first flexible printed circuit (FPC) board 130, and the first end part 131 may extend outside second board 120 while being connected to one end of the second board 120. Also, the second flexible printed circuit (FPC) board 140 includes a third end part 141 and a fourth end part 142 disposed on different ends of the second flexible printed circuit (FPC) board 140, and the third end part 141 may extend outside the second board 120 while being connected to another end of the second board 120.

The first flexible printed circuit (FPC) board 130 and the second flexible printed circuit (FPC) board 140 may be composed of, for example, a FPCB (Flexible Printed Circuit Board) and may be configured to have a length extended by a required amount. Since the first flexible printed circuit (FPC) board 130 and the second flexible printed circuit (FPC) board 140 have a flexible bending characteristic, it is possible for the first flexible printed circuit (FPC) board 130 and the second flexible printed circuit (FPC) board 140 to be partially bent and disposed to the side or the rear side in the set board.

The first flexible printed circuit (FPC) board 130 and the second flexible printed circuit (FPC) board 140 may be respectively integrated and with and extended from the second board 120 while being electrically connected to the second board 120. That is, the first flexible printed circuit (FPC) board 130 may include a conductive wiring layer on a flexible insulating base film and an insulating protective layer covering the conductive wiring layer, and the insulating base film of the first end part 131 may be integrated with the second board 120 by being interposed between the insulation layers of the second board 120. The wiring layer of the first end part 131 may be electrically connected to the wiring layer positioned in the second board 120 or a ground to be utilized for a signal transmission or be configured to be ground.

Likewise, the second flexible printed circuit (FPC) board 140 may include a conductive wiring layer on a flexible insulating base film and an insulating protective layer covering the conductive wiring layer, and the insulating base film of the third end part 141 may be integrated with the second board 120 by being interposed between the insulation layers of the second board 120. The wiring layer of the third end part 141 may be electrically connected to the wiring layer positioned in the second board 120 or a ground to be utilized for a signal transmission or be configured to be ground.

A connector 135 may be mounted on the second end part 132 of the first flexible printed circuit (FPC) board 130, and a connector 145 may be mounted on the fourth end part 142 of the second flexible printed circuit (FPC) board 140.

The connectors 135 and 145 are each an electrical connection device capable of transmitting electrical signals including power by mounting the electronic device module 100 on the set board. The connectors 135 and 145 may include any kind of connection element that is suitably designed in consideration of the function of the electronic device module 100 and the connection structure of the set board.

The connectors 135 and 145 are mounted on the second end part 132 of the first flexible printed circuit (FPC) board 130 and the fourth end part 142 of the second flexible printed circuit (FPC) board 140, respectively, such that the connectors 135 and 145 may be disposed and combined in various positions of the set board depending on the length and bending degree of the first flexible printed circuit (FPC) board 130 or the second flexible printed circuit (FPC) board 140.

Referring to the enlarged view of FIG. 2, an electrode pad 124 may be formed to protrude on the upper surface of the second board 120 facing the first board 110. The electrode pad 124 may be electrically connected to an external connection pad 114 of the first board 110. The second board 120 may include a conductive via 122 for electrically connecting the electrode pad 124 and circuit patterns formed inside the second board 120 to each other.

The electrode pad 124 may not protrude on the lower surface, which is the outer surface exposed to the outside toward the direction opposite to the direction faced by the upper surface in the second board 120. As described above, the electronic device module 100 may be mounted on the set board of the electronic apparatus using the connectors 135 and 145 mounted on the end parts of the first flexible printed circuit (FPC) board 130 and the second flexible printed circuit (FPC) board 140, so the electronic device module 100 may not be surface-mounted to the set board through an electrode pad formed on the lower surface of the second board 120. In this case, an electrode pad may be omitted on the lower surface of the second board 120.

Figure 3:
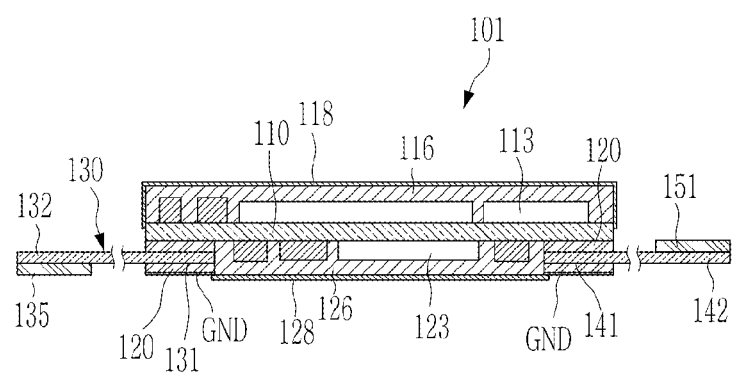
FIG. 3 is a cross-sectional view showing an electronic device module, according to another embodiment.

FIG. 3 is a cross-sectional view showing an electronic device module 101, according to another embodiment.

Referring to FIG. 3, in the electronic device module 101, the connector 135 may be mounted on the second end part 132 of the first flexible printed circuit (FPC) board 130, and an antenna 151 may be mounted on the fourth end part 142 of the second flexible printed circuit (FPC) board 140.

The connector 135 is an electrical connection element capable of transmitting electrical signals including power by mounting the electronic device module 101 on the set board. As described above, the connector 135 may be any kind of connection element that is suitably designed in consideration of the function of the electronic device module 101 and the connection structure of the set board.

The antenna 151 may include, for example, a radiation patch antenna and may perform a function of transmitting and receiving a radio frequency. However, the structure of the antenna 151 may include any kind of antenna structure that is appropriately designed in consideration of the function of the electronic device module 101 and the performance of the electronic device in which the electronic device 101 is to be installed, and may include a patch antenna, a chip antenna, a dipole antenna, a loop antenna, or a dielectric material resonator antenna.

Since the antenna 151 is mounted on the fourth end part 142 of the second flexible printed circuit (FPC) board 140, the antenna module 151 may be disposed and fixed to various positions including the side and the back of the electronic device depending on the length and bending degree of the second flexible printed circuit (FPC) board 140.

FIG. 4A to FIG. 4H are process views illustrating a method of manufacturing the electronic device module 101, according to an embodiment.

Figure 4A:
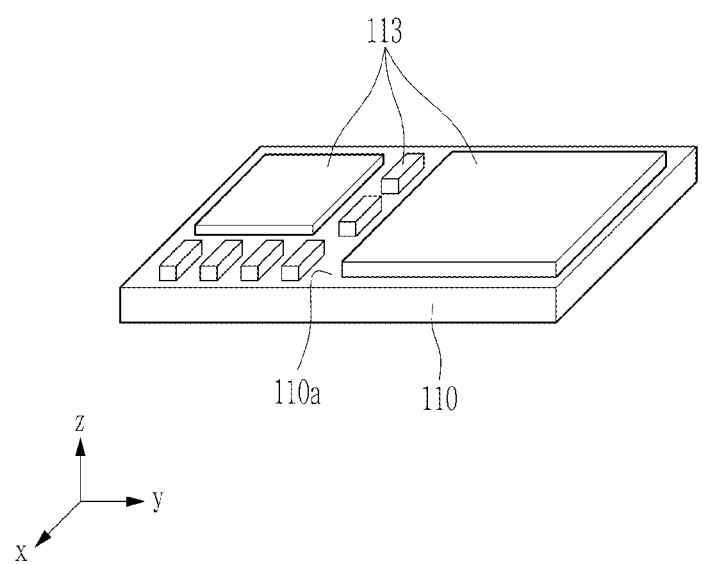
FIG. 4A to FIG. 4H are process views illustrating a method of manufacturing the electronic device module shown in FIG. 3, according to an embodiment.

According to the method of manufacturing the electronic device module 100, in a first operation illustrated in FIG. 4A, the first electronic device 113 is mounted on the first surface 110a of the first board 110 having the first surface 110a and the second surface 110b facing the opposite directions.

The first board 110 may be a multi-layered circuit board, for example, in which a plurality of insulation layers and a plurality of wiring layers are repeatedly deposited and formed in alternating sequence, and may be configured as a double-sided circuit board in which the wiring layers are formed on both surfaces of one insulation layer.

The first electronic device 113 may include an active device such as an integrated circuit chip (IC chip) or a passive device. That is, the first electronic device 113 may be any device that may be mounted on the first board 110 or may be embedded in the first board 110. For example, the first electronic device 113 may include a radio frequency integrated circuit (RFIC) chip, a WiFi integrated circuit (IC) chip, or a multi-layer ceramic capacitor (MLCC).

Figure 4B:
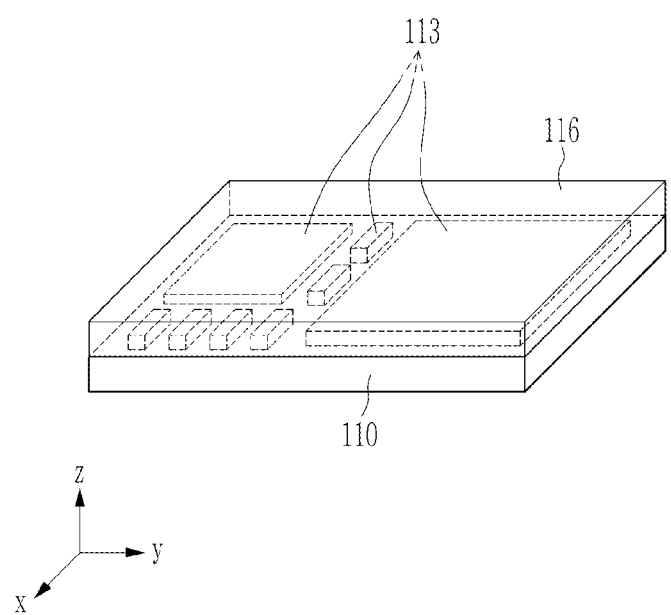

In another operation illustrated in FIG. 4B, the upper surface molded part 116 may be formed to cover and seal the first electronic device 113 on the first surface 110a of the first board 110.

The upper surface molded part 116 is formed to cover and seal the first electronic device 113 on the first board 110, and may be extended to cover the side surface of the first electronic device 113 and configured to contact the first board 110. The upper surface molded part 116 may be formed by using, for example, an epoxy mold compound (EMC) as a mold material.

Figure 4C:
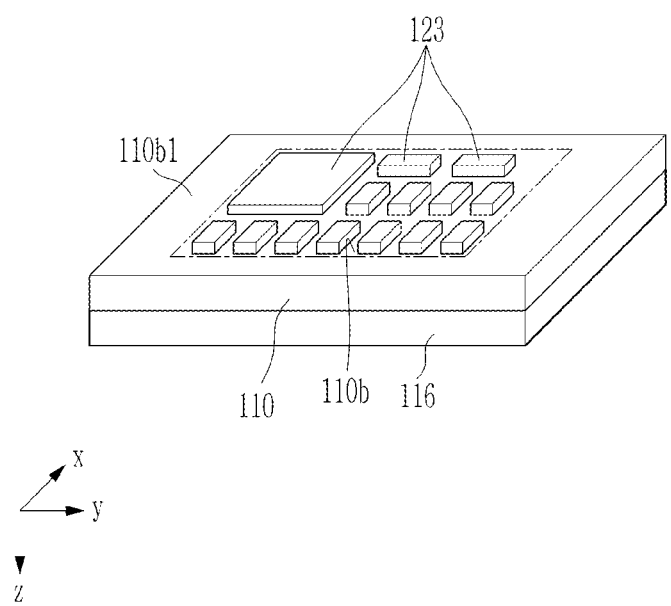

In another operation illustrated in FIG. 4C, the second electronic device 123 is mounted on the second surface 110b of the first board 110.

The second electronic device 123 may include an integrated circuit (IC) chip, for example, a radio frequency integrated circuit (RFIC) chip. Also, the IC chip may include a chip scale package (CSP).

When mounting the second electronic device 123 on the first board 110, the second electronic device 123 may be disposed in the region except for a second board attaching region 110b1 of the second surface 110b.

In addition, in order to integrally manufacture a plurality of electronic device modules, a group of a plurality of electronic devices may be mounted on both sides of a strip board.

In order to cut each unit forming a respective electronic device module 101, after performing the operation of mounting the second electronic device 123 on the first board 110, for example, the first board may be cut using a saw blade or a laser.

Figure 4D:
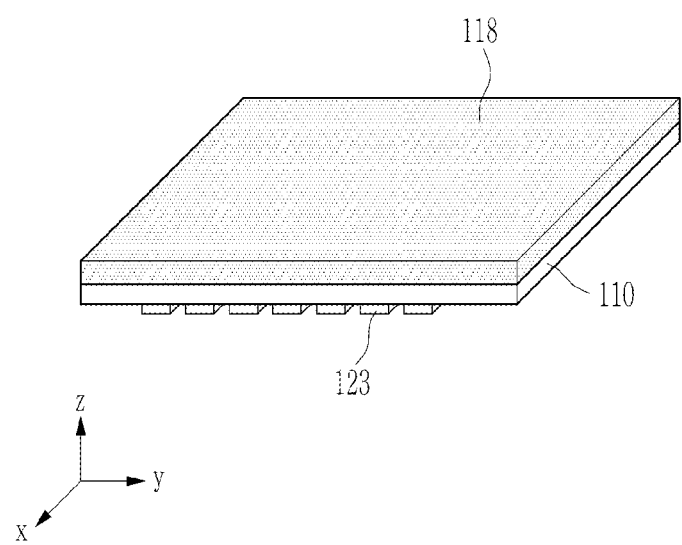

In another operation illustrated in FIG. 4D, an upper surface conductive layer 118 is formed on the upper surface of the upper surface molded part 116 while covering the upper surface molded part 116.

The upper surface conductive layer 118 may be formed by depositing a conductive material along the upper surface of the upper surface molded part 116 and the part of the side surface of the first board 110 to function as an electromagnetic interference (EMI) shield film. For example, the upper surface conductive layer 118 may be deposited in a sputtering process.

Figure 4E:
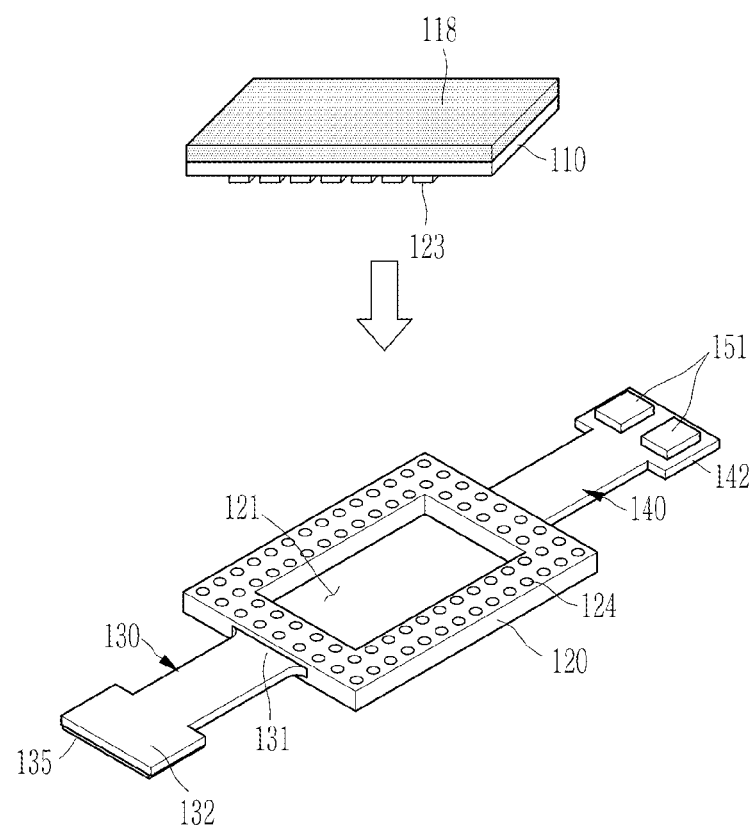
Figure 4F:
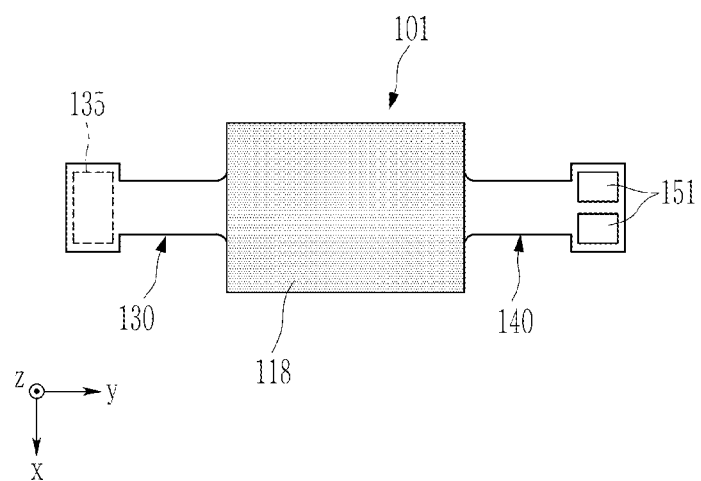

In another operation illustrated in FIG. 4E, the first board 110 is attached to the second board 120, in which the first flexible printed circuit (FPC) board 130 and the second flexible printed circuit (FPC) board 140 are connected to the opposite ends and are extended outside.

The second board 120 includes the device receiving part 121, which is formed by the space by removing the central portion of the second board 120. When the second board 120 is attached to the first board 110, the device receiving part 121 may form the space depressed to be concave while being open on one side of the resultant structure to expose a part of the second surface 110b of the first board 110.

The first flexible printed circuit (FPC) board 130 includes the first end part 131 and the second end part 132 positioned on different ends of the first flexible printed circuit (FPC) board 130, and the first end part 131 may extend to the outside of the second board 120 while being connected to one end of the second board 120. In addition, the second flexible printed circuit (FPC) board 140 includes a third end part 141 and a fourth end part 142 positioned on different ends of the second flexible printed circuit (FPC) board 140, and the third end part 141 may extend to the outside of the second board 120 while being connected to another end of the second board 120. The first flexible printed circuit (FPC) board 130 and the second flexible printed circuit (FPC) board 140 may be composed of, for example, a flexible printed circuit board (FPCB) and may be configured to have a length extended by a required amount. The connector 135 may be mounted on the second end part 132 of the first flexible printed circuit (FPC) board 130, and the antenna 151 may be mounted on the fourth end part 142 of the second flexible printed circuit (FPC) board 140.

Figure 4G:
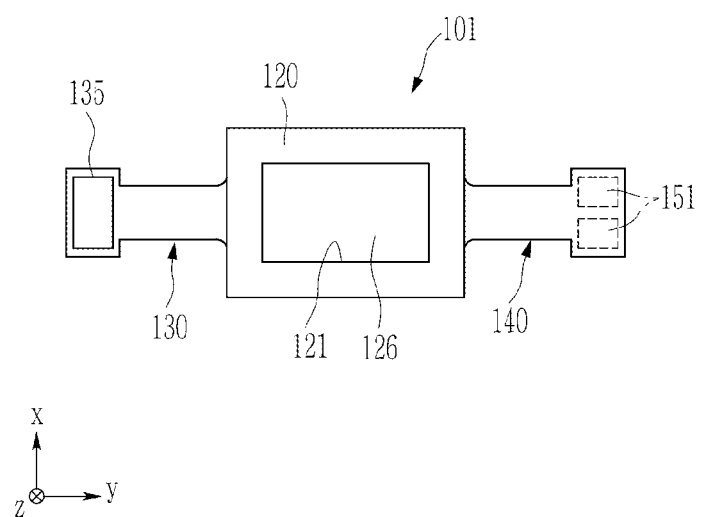

In another operation illustrated in FIG. 4G, the bottom surface molded part 126 is formed by covering the second electronic device 123 when the second electronic device 123 is accommodated in the device receiving part 121 of the second board 120, and filling the device receiving part 121 with a mold material and curing the mold material.

The bottom surface molded part 126 may be formed using, for example, an epoxy mold compound (EMC) as a mold material, and the part of the second board 120 defining the boundary of the device receiving part 121 functions as a dam in the molding process. The bottom surface molded part 126, which is cured by filling the device receiving part 121 with the epoxy mold compound (EMC), may be formed to have the same height as the second board 120 in in the thickness direction of the second board 120. That is, when the second board 120 has the outer surface (e.g., lower surface) facing the direction opposite to the direction faced by the surface of the second board 120 in contact with the first board 110, the outer surface (e.g., lower surface) of the bottom surface molded part 126 may be configured to be positioned on the same plane as the outer surface (e.g., lower surface) of the second board 120. To achieve this co-planar configuration of the outer surface (e.g., lower surface) of the bottom surface molded part 126 and the outer surface (e.g., lower surface) of the second board 120, the lower surface of the bottom surface molded part 126 may be flattened using a grinder, after being filled in the device receiving part 121 and cured.

Figure 4H:
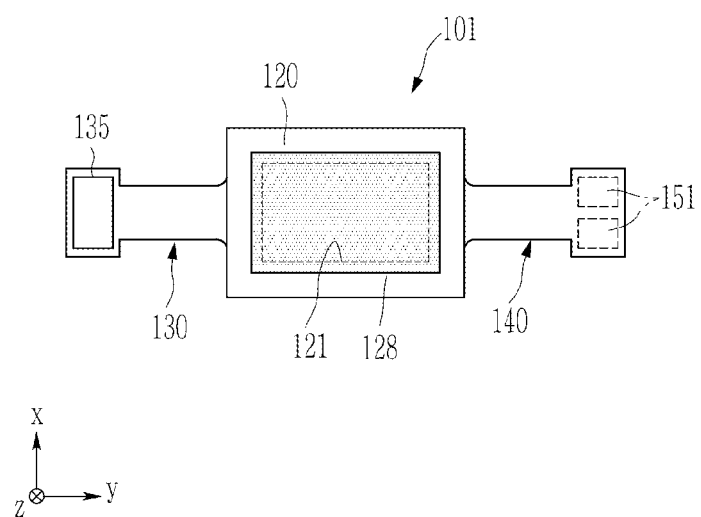

In another operation illustrated in FIG. 4H, the bottom surface conductive layer 128 is formed on the lower surface of the bottom surface molded part 126 while covering the bottom surface molded part 126.

The bottom surface conductive layer 128 may be formed by depositing a conductive material on the lower surface of the bottom surface molded part 126 and at least part of the outer surface of the second board 120 to function as an electromagnetic interference (EMI) shield film, For example, the bottom surface conductive layer 128 may be deposited in a sputtering process.

The bottom surface conductive layer 128 may be formed to have an area larger than the flat area of the device receiving part 121, and may be coated to cover all of the lower surface of the bottom surface molded part 126 defined by the boundary of the device receiving part 121. Therefore, the bottom surface conductive layer 128 may be formed to cover a portion of the outer surface (e.g., lower surface) of the second board 120 adjacent to the lower surface of the bottom surface molded part 126.

The bottom surface conductive layer 128 may be connected to the ground (GND) by exposing an inner ground (GND) copper foil of the second board 120 so that the bottom surface conductive layer 128 is connected to the ground (GND).

In the above description of FIGS. 4A to 4H, the electronic device module 101 FIG. 3 is applied as an example to describe the manufacturing method. However, the manufacturing method may also be applied to the electronic device module 100 shown in FIGS. 1 and 2.

Figure 5:
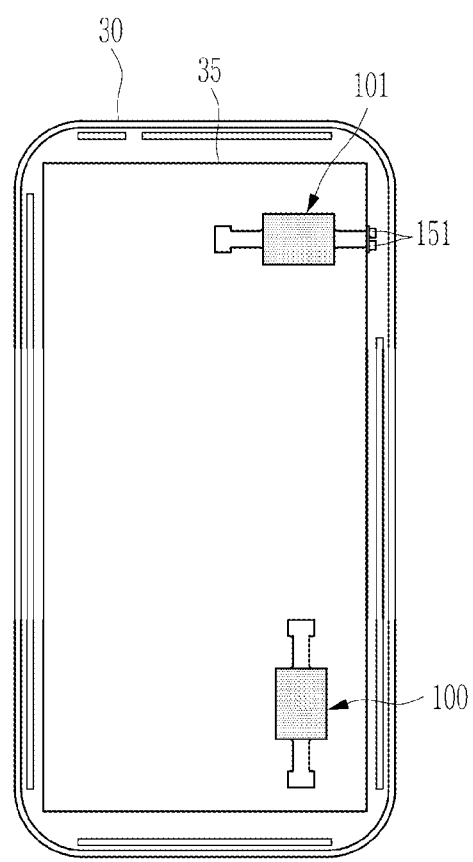
FIG. 5 is a rear view schematically showing an electronic apparatus including electronic device modules, according to an embodiment.

FIG. 5 is a rear view schematically showing an electronic apparatus 30 including electronic device modules 100 and 101, according to an embodiment.

Referring to FIG. 5, the electronic apparatus 30 may be configured by disposing the electronic device modules 100 and 101 on a built-in set board 35. The electronic apparatus 30 may include polygonal sides, and the electronic device modules 100 and 101 may be disposed adjacent to at least a portion of a plurality of sides of the electronic apparatus 30.

Since the first and second flexible printed circuit (FPC) boards 130 and 140 of the electronic device modules 100 and 101 have a characteristic of bending flexibly, it is possible for the electronic device modules 100 and 101 to be partially bent to a side surface or a rear surface of the set board 35. For example, the electronic device module 100/101 (e.g., the first and/or second flexible printed circuit (FPC) boards 130 and 140) may be bent such that the first board 110 and the second board 120 are disposed on a front surface of the set board 35, and the antenna 151 is disposed on the side surface of the set board 35.

The electronic apparatus 30 may be a smart phone, a personal digital assistant, a digital video camera, a digital still camera, a network system, a computer, a monitor, a tablet, a laptop, a netbook, a television, a video game, a smart watch, an automotive part, etc., but it is not limited thereto.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

DESCRIPTION OF SYMBOLS 100, 101: electronic device module
110, 120: first board, second board
113, 123: first electronic device, second electronic device
116: upper surface molded part
118: upper surface conductive layer
121: device receiving part
126: bottom surface molded part
128: bottom surface conductive layer
130, 140: first flexible printed circuit (FPC) board, second flexible printed circuit (FPC) board
131, 132, 141, 142: first end part, second end part, third end part, fourth end part
135, 145: connector
151: antenna

What is claimed is:

1. An electronic device module, comprising:
a first board a having first surface and a second surface facing opposite directions;
electronic devices mounted on the first and second surfaces, respectively;
a second board bonded to the second surface and including a device receiving part in which a device, among the electronic devices, is received, wherein the device receiving part is formed by a central opening of the second board;
a first flexible printed circuit (FPC) board including a first end part and a second end part disposed on opposite ends of the first flexible printed circuit (FPC) board, wherein the first flexible printed circuit (FPC) board is more flexible than the first board and the second board, and wherein the first end part is formed integrally with the second board, is electrically connected to one end of the second board, and extends outside the second board; and
a connector mounted on the second end part.

2. The electronic device module of claim 1, further comprising
a second FPC board including a third end part and a fourth end part disposed on opposing ends of the second FPC board, wherein the third end part extends outside the second board and is electrically connected to another end of the second board.

3. The electronic device module of claim 2, further comprising:
a connector mounted on the fourth end part.

4. The electronic device module of claim 2, further comprising:
an antenna mounted on the fourth end part.

5. The electronic device module of claim 2, wherein the second flexible printed circuit (FPC) board is formed integrally with the second board, is electrically connected to the second board, and extends outside the second board.

6. The electronic device module of claim 1, further comprising a bottom surface molded part mounted on the second surface of the first board,
wherein the bottom surface molded part covers the electronic device, among the electronic devices, received in the device receiving part, and fills and seals the device receiving part.

7. The electronic device module of claim 6, further comprising:
a bottom surface conductive layer covering the bottom surface molded part and formed on a surface of the bottom surface molded part.

8. The electronic device module of claim 7, wherein the bottom surface conductive layer is connected to a ground of the second board.

9. The electronic device module of claim 6, wherein the second board further includes an outer surface opposite to a surface of the second board in contact with the first board, and
wherein the surface of the bottom surface molded part and the outer surface of the second board are disposed on a same plane.

10. The electronic device module of claim 6, further comprising:
an upper surface molded part covering and sealing an electronic device, among the electronic devices, mounted on the first surface.

11. The electronic device module of claim 10, further comprising:
an upper surface conductive layer covering the upper surface molded part and formed on a surface of the upper surface molded part.

12. The electronic device module of claim 1, wherein an electrode pad does not protrude on an outer surface of the second board opposite to a surface of the second board in contact with the first board.

13. A method of manufacturing an electronic device module, comprising:
mounting a first electronic device on a first surface of a first board;
forming an upper surface molded part covering and sealing the first electronic device on the first surface of the first board;
mounting a second electronic device on a second surface of the first board disposed opposite to the first surface of the first board;
attaching the first board to a second board such that the second electronic device is received in a device receiving part of the second board, wherein the device receiving part is formed of a space in by a central opening of the second board, and wherein a flexible printed circuit (FPC) board is connected to one end of the second board and is extended outside the second board; and
forming a bottom surface molded part covering the second electronic device by filling the device receiving part with a mold material and curing the mold material.

14. The method of claim 13, further comprising:
forming a bottom surface conductive layer covering the bottom surface molded part on a surface of the bottom surface molded part and at least part of an outer surface of the second board.

15. The method of claim 13, further comprising mounting an electrical connector or an antenna on the flexible printed circuit (FPC) board.

16. The method of claim 13, further comprising removing a portion of the bottom surface molded part such that an outer surface of the bottom surface molded part is on a same plane as an outer surface of the second board surrounding the bottom surface molded part.

17. An electronic device, comprising:
a set board; and
an electronic device module disposed on the set board, and comprising:
a first board having first surface and a second surface facing opposite directions;
a first electronic device mounted on the first surface;
a second electronic device mounted on the second surface;
a second board bonded to the second surface and including a central open space in which the second electronic device is disposed;
a first flexible printed circuit (FPC) board including a first end part and a second end part disposed on opposite ends of the first flexible printed circuit (FPC) board, wherein the first flexible printed circuit (FPC) board is more flexible than the first board and the second board, and wherein the first end part is formed integrally with the second board, is electrically connected to one end of the second board, and extends outside the second board; and
a connector mounted on the second end part.

18. The electronic device of claim 17, further comprising:
a second FPC board including a third end part and a fourth end part disposed on opposing ends of the second FPC board, wherein the third end part extends outside the second board and is electrically connected to another end of the second board.

19. The electronic device of claim 18, further comprising:
a connector mounted on the fourth end part.

20. The electronic device of claim 18, further comprising:
an antenna mounted on the fourth end part.

* * * * *